United States Patent
Kang

(10) Patent No.: US 8,610,460 B2
(45) Date of Patent: Dec. 17, 2013

(54) CONTROL SIGNAL GENERATION CIRCUITS, SEMICONDUCTOR MODULES, AND SEMICONDUCTOR SYSTEMS INCLUDING THE SAME

(75) Inventor: Tae Jin Kang, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/590,885

(22) Filed: Aug. 21, 2012

(65) Prior Publication Data

US 2013/0222009 A1    Aug. 29, 2013

(30) Foreign Application Priority Data

Feb. 24, 2012  (KR) .................. 10-2012-0019326

(51) Int. Cl.
| | |
|---|---|
| H03K 17/16 | (2006.01) |
| H03K 19/003 | (2006.01) |
| G11C 5/14 | (2006.01) |
| G11C 7/10 | (2006.01) |

(52) U.S. Cl.
USPC .............................. 326/30; 365/227; 365/191

(58) Field of Classification Search
USPC .................................... 326/30; 365/227, 191
See application file for complete search history.

(56) References Cited

U.S. PATENT DOCUMENTS

| 7,449,914 B2 * | 11/2008 | Kim et al. ................... 326/30 |
| 2006/0106951 A1 * | 5/2006 | Bains ........................... 710/5 |
| 2010/0302893 A1 * | 12/2010 | Sato et al. .................. 365/227 |
| 2011/0058442 A1 * | 3/2011 | Fujisawa ................. 365/233.1 |
| 2011/0058445 A1 * | 3/2011 | Fujisawa ................. 365/233.1 |
| 2011/0205832 A1 * | 8/2011 | Jeon ..................... 365/233.16 |
| 2013/0002291 A1 * | 1/2013 | Park ............................ 326/30 |
| 2013/0031305 A1 * | 1/2013 | Fujisawa ................... 711/106 |

FOREIGN PATENT DOCUMENTS

| KR | 100927401 B1 | 11/2009 |
| WO | 2007081460 A1 | 7/2007 |

* cited by examiner

*Primary Examiner* — Shawki Ismail
*Assistant Examiner* — Dylan White
(74) *Attorney, Agent, or Firm* — William Park & Associates Patent Ltd.

(57) ABSTRACT

Semiconductor modules are provided. The semiconductor module includes a first semiconductor chip configured for storing an information signal that is set in response to a command/address signal and which determines reception of an on-die termination (ODT) signal in a power down mode in response to the information signal to control activation of a first ODT circuit; and a second semiconductor chip configured for sharing and utilizing the first ODT circuit included in the first semiconductor chip.

23 Claims, 3 Drawing Sheets

CONTROL SIGNAL GENERATION CIRCUITS, SEMICONDUCTOR MODULES, AND SEMICONDUCTOR SYSTEMS INCLUDING THE SAME

CROSS-REFERENCES TO RELATED APPLICATIONS

The present application claims priority under 35 U.S.C 119(a) to Korean Application No. 10-2012-0019326, filed on Feb. 24, 2012, in the Korean Intellectual Property Office, which is incorporated herein by reference in its entirety.

BACKGROUND

Embodiments of the present disclosure may relate to integrated circuit devices, control signal generation circuits, semiconductor modules, and semiconductor systems including the same.

Within semiconductor systems, it is generally necessary to match the impedance of a transmission line (e.g., a transmission channel) with the corresponding termination impedance (e.g., a termination resistor) in order to prevent undesirable signal reflections. Such signal reflections act as noise on the signal line in relation to signals subsequently transmitted on the transmission line. The termination resistors of the conventional semiconductor modules or systems have been disposed outside semiconductor chips constituting the semiconductor modules or systems. However, in the event that the termination resistors are disposed outside high performance semiconductor chips such as double data rate 2(DDR2) synchronous dynamic random access memory (SDRAM) chips, there may be some limitations in preventing the undesirable signal reflections.

Recently, the termination resistors have been disposed inside the high performance semiconductor chips to prevent the undesirable signal reflections. That is, on-die termination (ODT) circuits have been widely used in the semiconductor modules and/or the semiconductor systems. In general, the ODT circuit may be enabled to operate when an ODT signal having a logic high voltage level is applied to an ODT pad of the semiconductor chip. Also, the ODT circuit may be disabled not to operate when an ODT signal having a logic high voltage level is applied to the ODT pad of the semiconductor chip.

A pair of semiconductor chips may be packaged to realize a semiconductor module, and the semiconductor module may employ a dual rank configuration so that the pair of semiconductor chips of the semiconductor module are controlled by a single shared channel. The single shared channel may include a data channel through which data is inputted and/or outputted and an address/command channel through which an address signal and command signal is inputted and/or outputted.

In the semiconductor module employing the dual rank configuration, each of the semiconductor chips may include the ODT circuit. Thus, two ODT signals may be required to independently operate the ODT circuits included in the semiconductor chips, and the semiconductor module should be configured to include pins for receiving the ODT signals. If the number of the pins of the semiconductor module increases, manufacturing costs of the semiconductor module may also increase. Accordingly, in the conventional semiconductor module including two semiconductor chips, the ODT circuit of one of the semiconductor chips may be disabled and both the semiconductor chips may share the ODT circuit of the other semiconductor chip. As a result, the manufacturing costs of the semiconductor module can be reduced since only one pin is required to receive the ODT signal.

Meanwhile, in the conventional semiconductor module employing the dual rank configuration, the semiconductor chip having the disabled ODT circuit may not have any available ODT circuits when the semiconductor chip having the shared ODT circuit is in a power down mode. That is, when the semiconductor chip having the shared ODT circuit is in the power down mode, the shared ODT circuit may be disabled. Accordingly, if the semiconductor chip having the shared ODT circuit is in the power down mode, the shared ODT circuit may not be activated even though the semiconductor chip having the disabled ODT circuit executes a write operation.

SUMMARY

Embodiments are directed to control signal generation circuits, semiconductor modules, and semiconductor systems including the same.

According to various embodiments, a semiconductor module includes a first semiconductor chip configured for storing an information signal that is set in response to a command/address signal and which determines reception of an on-die termination (ODT) signal in a power down mode in response to the information signal to control activation of a first ODT circuit; and a second semiconductor chip configured for sharing and utilizing the first ODT circuit included in the first semiconductor chip.

According to various other embodiments, a semiconductor system includes a memory controller configured for outputting a command/address signal and an ODT signal; the memory controller configured for receiving and outputting data; and a semiconductor module including a first semiconductor chip which has a first ODT circuit connected to a first data receiver for receiving the data and a second semiconductor chip which has a second ODT circuit connected to a second data receiver for receiving the data, wherein the first semiconductor chip is configured for storing an information signal that is set according to the command/address signal and determining reception of the ODT signal in a power down mode in response to the information signal for controlling the activation of the first ODT circuit.

According to various other embodiments, a control signal generation circuit includes a receiver configured for receiving and buffering a command/address signal outputted from a memory controller to generate an internal command signal and an internal address signal; a command decoder configured for decoding the internal command signal to generate a mode register set signal for setting a mode register and to generate a deep power down mode signal, a self refresh signal, and a power down mode signal; the mode register configured for storing and outputting an information signal set by the internal address signal in response to the mode register set signal; and an ODT controller configured for receiving the deep power down mode signal, the self refresh signal, and the power down mode signal in response to the information signal to generate a control signal, wherein the control signal is enabled to activate an ODT circuit for receiving an ODT signal when the power down mode signal and the information signal are enabled.

BRIEF DESCRIPTION OF THE DRAWINGS

Embodiments of the inventive concept will become more apparent in view of the attached drawings and accompanying detailed description.

DETAILED DESCRIPTION

Figure 1:
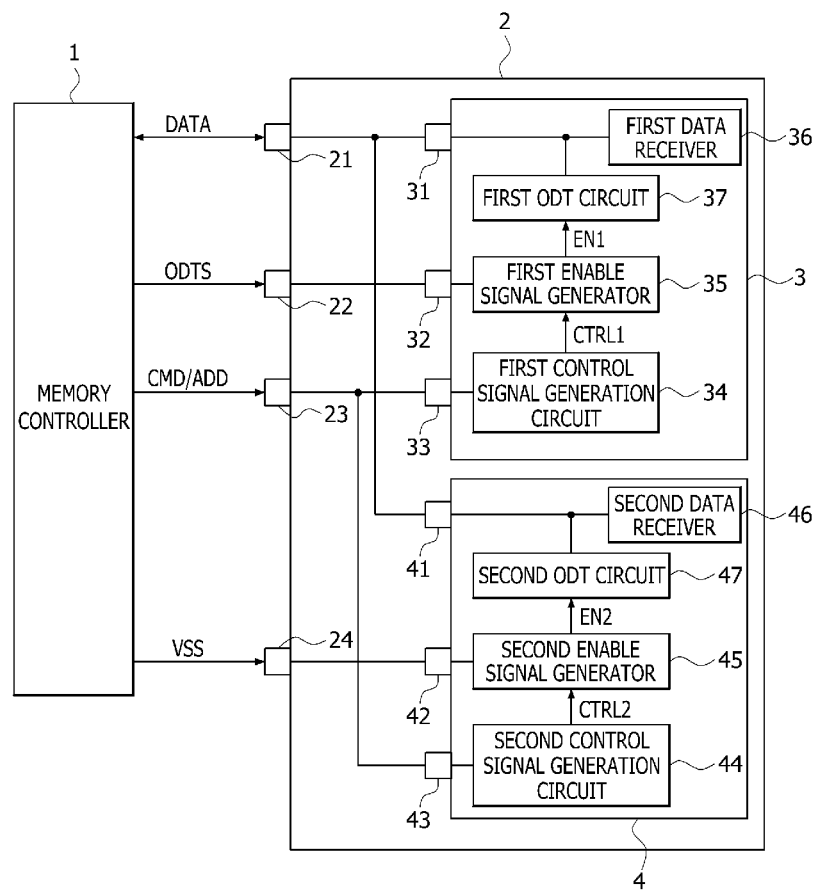
FIG. 1 is a block diagram illustrating an example of a configuration of a semiconductor system according to an embodiment.

Embodiments are described below with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough and complete, and will convey the scope of the disclosure to those skilled in the art. It is to be understood herein that the drawings are not necessarily to scale and in some instances proportions may have been exaggerated in order to more clearly depict certain features of the invention. In the drawings, the same reference numerals or the same reference designators denote the same elements throughout the specification.

The terminology used herein is for the purpose of describing particular embodiments only and is not intended to limit the embodiments. As used herein, the singular forms "a," "an," and "the" are intended to include the plural forms as well, unless the context clearly indicates otherwise. It will be further understood that the terms "has", "having", "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a configuration of a semiconductor system according to an embodiment.

As illustrated in FIG. 1, a semiconductor system according to the present embodiment may include a memory controller 1 and a semiconductor module 2. The memory controller 1 may be configured to receive and output data DATA. Further, the memory controller 1 may apply an ODT signal ODTS, a command/address signal CMD/ADD, and a ground voltage VSS to the semiconductor module 2. The semiconductor module 2 may include data pins 21 through which the data DATA may be inputted and outputted, an ODT pin 22 through which the ODT signal ODTS is inputted, command/address pins 23 which the command/address signal CMD/ADD is inputted, a power pin 24 which a ground voltage VSS is applied, a first semiconductor chip 3 and a second semiconductor chip 4.

The first semiconductor chip 3 may be configured to include first data pads 31, a first ODT pad 32, first command/address pads 33, a first control signal generation circuit 34, a first enable signal generator 35, a first data receiver 36, and a first ODT circuit 37. The first data pads 31 may receive the data DATA through the data pins 21 or may output the data DATA to the memory controller 1 through the data pins 21. The first ODT pad 32 may receive the ODT signal ODTS through the ODT pin 22. The first command/address pads 33 may receive the command/address signal CMD/ADD through the command/address pins 23. The first control signal generation circuit 34 may generate a first control signal CTRL1 determining whether the first enable signal generator 35 has to receive the ODT signal ODTS in a power down mode in response to the command/address signal CMD/ADD which passes through the command/address pads 33. The first enable signal generator 35 may receive the ODT signal ODTS in response to the first control signal CTRL1, thereby generating a first enable signal EN1. The first ODT circuit 37 may be connected to the first data receiver 36 receiving the data DATA and may be activated in response to the first enable signal EN1.

The second semiconductor chip 4 may be configured to include second data pads 41, a second ODT pad 42, second command/address pads 43, a second control signal generation circuit 44, a second enable signal generator 45, a second data receiver 46 and a second ODT circuit 47. The second data pads 41 may receive the data DATA through the data pins 21 or may output the data DATA to the memory controller 1 through the data pins 21. The second ODT pad 42 may receive the ground voltage VSS through the power pin 24. The second command/address pads 43 may receive the command/address signal CMD/ADD through the command/address pins 23. The second control signal generation circuit 44 may receive the command/address signal CMD/ADD through the second command/address pads 43 to generate a second control signal CTRL2. The second enable signal generator 45 may receive the ground voltage VSS to generate a second enable signal EN2, which actually corresponds to a disable signal, regardless of a logic level (e.g., a logic state) of the second control signal CTRL2. The second ODT circuit 47 may be connected to the second data receiver 46 receiving the data DATA and may be inactivated in response to the second enable signal EN2.

This semiconductor system according to the present embodiment may employ the dual rank configuration where the first and second semiconductor chips 3 and 4 share a single data channel. Further, the first and second semiconductor chips 3 and 4 may share and use the first ODT circuit 37 with the inactivated second ODT circuit 47. In various embodiments, the number of second semiconductor chips 4 having an inactivated ODT circuit 47 may not be limited to one. For example, the semiconductor system according to various embodiments may be configured to include a plurality of second semiconductor chips 4 having an inactivated second ODT circuits 47.

Figure 2:
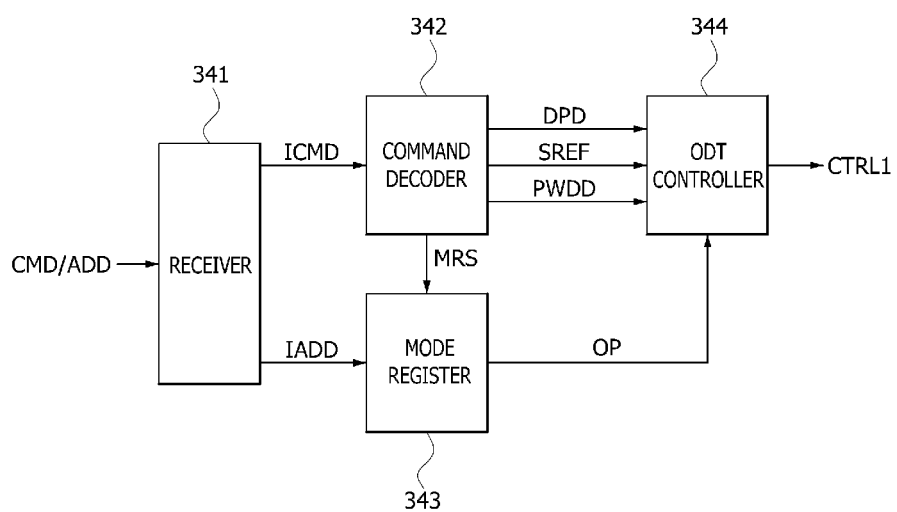
FIG. 2 is a block diagram illustrating an example of a configuration of a control signal generation circuit included in the semiconductor system illustrated in FIG. 1.

FIG. 2 is a block diagram illustrating an example of a configuration of the first control signal generation circuit 34 illustrated in FIG. 1.

As illustrated in FIG. 2, the first control signal generation circuit 34 may be configured to include a receiver 341, a command decoder 342, a mode register 343, and an ODT controller 344. The receiver 341 may receive and buffer the command/address signal CMD/ADD to generate an internal command signal ICMD and an internal address signal IADD. The number of bits in the internal command signal ICMD and the internal address signal IADD may vary according to the various embodiments. The command decoder 342 may decode the internal command signal ICMD to generate a mode register set signal MRS for setting the mode register 343 and also to generate a deep power down mode signal DPD, a self refresh signal SREF, and a power down mode signal PWDD. Setting the mode register 343 may involve an operation to set various parameters such as a burst length and a column address strobe (CAS) latency in an initial operation mode of the first semiconductor chip 3. The deep power down mode signal DPD may be enabled to have a logic "high" voltage state during a deep power down mode for electrically disconnecting all the current paths of the semiconductor module 2. In addition, the self refresh signal SREF may be enabled to have a logic "high" voltage state during a self refresh operation, and the power down mode signal PWDD may be enabled to have a logic "high" voltage state while the first semiconductor chip 3 is in a power down mode for stopping the generation of an internal clock signal to suppress power consumption of the first semiconductor chip 3.

When the mode register set signal MRS is enabled to have a logic "high" voltage state, the mode register 343 may extract information signal OP from the internal address signal IADD to store the information signal OP therein and may output the information signal OP. The mode register 343 may be configured to include a typical storage circuit for storing a signal, and an output timing of the information signal OP may not be limited to a specific value. That is, the output timing of the information signal OP may be set to have different values according to various embodiments. For example, the mode register 343 may be configured such that the information signal OP may be outputted in response to a mode register read command.

In the event that a semiconductor system including the ODT controller 344 enters a deep power down mode or a self refresh mode, the first control signal CTRL1 outputted from the ODT controller 344 may be disabled to have a logic "low" voltage state. Further, the first control signal CTRL1 of the ODT controller 344 may be enabled or disabled according to the logic level of the information signal OP in the power down mode.

Configurations and operations of the ODT controller 344 will be described below with reference to FIGS. 3 and 4.

Figure 3:
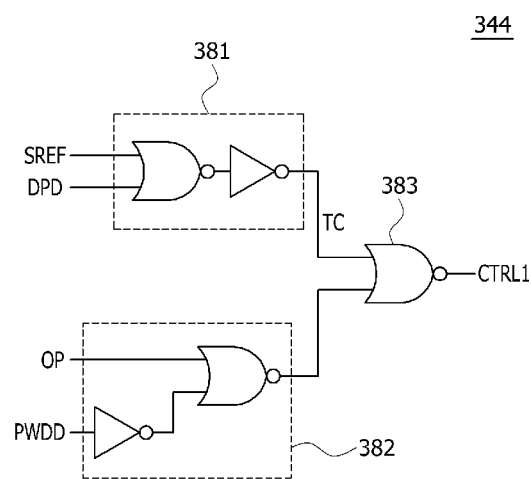
FIG. 3 is a circuit diagram illustrating an example of an on-die termination (ODT) controller included in the control signal generation circuit illustrated in FIG. 2.

FIG. 3 is a circuit diagram illustrating an example of the on-die termination (ODT) controller 344 included in the first control signal generation circuit 34 illustrated in FIG. 2.

As illustrated in FIG. 3, the ODT controller 344 may be configured to include a transmission signal generator 381, a buffer 382, and a transmission element 383. When a semiconductor system including the ODT controller 344 does not enter the deep power down mode and the self refresh mode, the transmission signal generator 381 may receive the self refresh signal SREF and the deep power down mode signal DPD to generate a transmission signal TC enabled to have a logic "low" voltage state. The buffer 382 may buffer and output the power down mode signal PWDD when the information signal OP has a logic "low" voltage state, and the buffer 382 may output the power down mode signal PWDD having a logic "low" voltage state when the information signal OP has a logic "high" voltage state. When transmission signal TC is enabled to have a logic "low" voltage state, the transmission element 383 may buffer and invert the output signal of the buffer 382 and may output the inverted output signal of the buffer 382.

As described with reference to FIGS. 2 and 3, the ODT controller 344 may output the first control signal CTRL1 disabled to have a logic "low" voltage state when the deep power down mode signal DPD or the self refresh signal SREF is enabled to have a logic "high" voltage state. Moreover, when the information signal OP has a logic "low" voltage state, the ODT controller 344 may generate the first control signal CTRL1 disabled to have a logic "low" voltage state during the power down mode (e.g., while the power down mode signal PWDD has a logic "high" voltage state). In contrast, when the information signal OP has a logic "high" voltage state together with the disabled self refresh signal SREF and the disabled deep power down mode signal DPD, the ODT controller 344 may generate the first control signal CTRL1 enabled to have a logic "high" voltage state even during the power down mode (e.g., even while the power down mode signal PWDD is enabled to a logic "high" voltage state).

Figure 4:
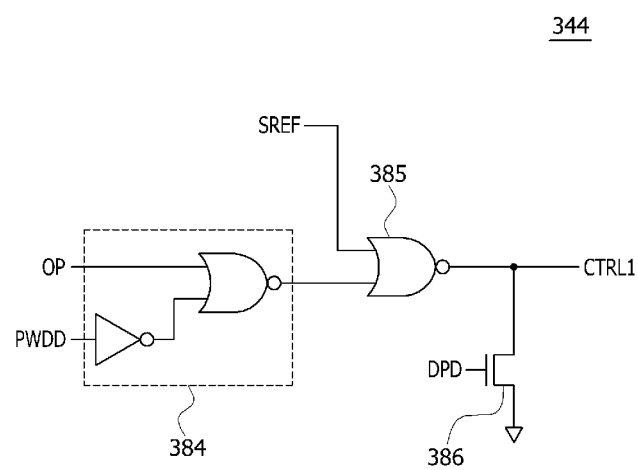
FIG. 4 is a circuit diagram illustrating an example of an on-die termination (ODT) controller included in the control signal generation circuit illustrated in FIG. 2.

FIG. 4 is a circuit diagram illustrating an example of the on-die termination (ODT) controller 344 included in the first control signal generation circuit 34 illustrated in FIG. 2.

As illustrated in FIG. 4, the ODT controller 344 may be configured to include a buffer 384, a transmission element 385, and a pull-down element 386. The buffer 384 may buffer and output the power down mode signal PWDD when the information signal OP has a logic "low" voltage state, and the buffer 384 may output the power down mode signal PWDD having a logic "low" voltage state when the information signal OP has a logic "high" voltage state. When the self refresh signal SREF is enabled to execute a self refresh operation, the transmission element 385 may generate and output the first control signal CTRL1 disabled to have a logic "low" voltage state in response to the enabled self refresh signal SREF. When the self refresh signal SREF is disabled not to execute the self refresh operation, the transmission element 385 may buffer and invert the output signal of the buffer 384 to output the buffered and inverted output signal of the buffer 384 as the first control signal CTRL1. The pull-down element 386 may receive the deep power down mode signal DPD to pull down or float the first control signal CTRL1. For example, when the deep power down mode signal DPD is enabled to have a logic "high" voltage state, the first control signal CTRL1 may be pulled down to have a logic "low" voltage state by the pull-down element 386.

As described with reference to FIGS. 2 and 4, the ODT controller 344 may output the first control signal CTRL1 disabled to have a logic "low" voltage state when the deep power down mode signal DPD or the self refresh signal SREF is enabled to have a logic "high" voltage state. Moreover, when the information signal OP is disabled to have a logic "low" voltage state, the ODT controller 344 may generate the first control signal CTRL1 disabled to have a logic "low" voltage state during the power down mode (e.g., while the power down mode signal PWDD has a logic "high" voltage state). In contrast, when the information signal OP is enabled to have a logic "high" voltage state together with the disabled self refresh signal SREF and the disabled deep power down mode signal DPD, the ODT controller 344 may generate the first control signal CTRL1 enabled to have a logic "high" voltage state even during the power down mode (e.g., even while the power down mode signal PWDD is enabled to a logic "high" voltage state).

As described above, the semiconductor system according to the embodiments may operate in the deep power down mode, the self refresh mode, the power down mode with the information signal OP having a logic "low" voltage state, or the power down mode with the information signal OP having a logic "high" voltage state.

First, when the semiconductor system according to the various embodiments operate in the deep power down mode or the self refresh mode, the first control signal CTRL1 may be disabled to have a logic "low" voltage state. Thus, the first ODT circuit 37 may be inactivated since the first control signal CTRL1 is disabled to have a logic "low" voltage state.

Next, when the semiconductor system according to the various embodiments enter the power down mode and the information signal OP has a logic "low" voltage state, the first control signal CTRL1 may be disabled to have a logic "low" voltage state. Thus, the first ODT circuit 37 may be inactivated since the first control signal CTRL1 is disabled to have a logic "low" voltage state.

Finally, when the semiconductor system according to the various embodiments enter the power down mode and the information signal OP has a logic "high" voltage state, the first control signal CTRL1 may be enabled to have a logic "high" voltage state. Thus, the first ODT circuit 37 may be activated since the first control signal CTRL1 is disabled to have a logic "high" voltage state.

In conclusion, even though the semiconductor system according to the various embodiments operate in the power down mode, the first ODT circuit 37 may be activated according to the information signal OP that is set by the internal address signal IADD. That is, if the information signal OP has a logic "high" voltage state, the first ODT circuit 37 may be activated even though the first semiconductor chip 3 enters the power down mode and the second semiconductor chip 4 executes a write operation. Accordingly, even if the first semiconductor chip 3 enters the power down mode, the second semiconductor chip 4 may utilize the first ODT circuit 37.

The various embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor module comprising:
 a first semiconductor chip configured for storing an information signal that is set in response to a command/address signal and which determines reception of an on-die termination (ODT) signal in a power down mode in response to the information signal to control activation of a first ODT circuit; and
 a second semiconductor chip configured for sharing and utilizing the first ODT circuit included in the first semiconductor chip.

2. The semiconductor module of claim 1, wherein the first semiconductor chip is configured to receive the ODT signal to activate the first ODT circuit when the information signal is enabled and does not receive the ODT signal to inactivate the first ODT circuit when the information signal is disabled.

3. The semiconductor module of claim 1, wherein the ODT signal is not inputted to the first semiconductor chip in a self refresh mode or a deep power down mode.

4. The semiconductor module of claim 1, wherein the first semiconductor chip includes:
 a control signal generation circuit configured for receiving the command/address signal to generate a first control signal that controls reception of the ODT signal;
 a first enable signal generator configured for receiving the ODT signal in response to the first control signal to generate a first enable signal; and
 the first ODT circuit which is electrically connected to a first data receiver for receiving data and which is activated in response to the first enable signal.

5. The semiconductor module of claim 4, wherein the control signal generation circuit includes:
 a receiver configured for receiving and buffering the command/address signal to generate an internal command signal and an internal address signal;
 a command decoder configured for decoding the internal command signal to generate a mode register set signal for setting a mode register and to generate a deep power down mode signal, a self refresh signal, and a power down mode signal;
 a mode register configured for storing and outputting the information signal set by the internal address signal in response to the mode register set signal; and
 an ODT controller configured for receiving the deep power down mode signal, the self refresh signal, and the power down mode signal in response to the information signal to generate the first control signal.

6. The semiconductor module of claim 5:
 wherein the deep power down mode signal is enabled during a deep power down mode for electrically disconnecting all current paths in the first and second semiconductor chips;
 wherein the self refresh signal is enabled during a self refresh operation; and
 wherein the power down mode signal is enabled during a power down mode in which generation of an internal clock signal of the first semiconductor chip is stopped.

7. The semiconductor module of claim 5, wherein the ODT controller includes:
 a transmission signal generator configured for generating a transmission signal which is enabled when the deep power down mode signal and the self refresh signal are disabled;
 a buffer configured for buffering and outputting the power down mode signal or an inverted signal of the power down mode signal in response to the information signal; and
 a transmission element configured for outputting the output signal of the buffer as the first control signal in response to the transmission signal.

8. The semiconductor module of claim 5, wherein the ODT controller includes:
 a buffer configured for buffering and outputting the power down mode signal or an inverted signal of the power down mode signal in response to the information signal;
 a transmission element configured for outputting an inverted signal of the output signal of the buffer as the first control signal when the self refresh signal is disabled; and
 a pull-down element configured for disabling the first control signal in response to the deep power down mode signal.

9. The semiconductor module of claim 4, wherein the second semiconductor chip includes:

a second enable signal generator configured for receiving a ground voltage to generate a second enable signal that is disabled; and a second ODT circuit which is electrically connected to a second data receiver for receiving the data and which is configured for being inactivated in response to the second enable signal.

10. A semiconductor system comprising:

a memory controller configured for outputting a command/address signal and an ODT signal;

the memory controller configured for receiving and outputting data; and a semiconductor module including a first semiconductor chip which has a first ODT circuit connected to a first data receiver for receiving the data and a second semiconductor chip which has a second ODT circuit connected to a second data receiver for receiving the data, wherein the first semiconductor chip is configured for storing an information signal that is set according to the command/address signal and determining reception of the ODT signal in a power down mode in response to the information signal for controlling the activation of the first ODT circuit.

11. The semiconductor system of claim 10, wherein the second ODT circuit is configured to be inactivated by a ground voltage outputted from the memory controller.

12. The semiconductor system of claim 10, wherein the first semiconductor chip is configured for receiving the ODT signal to activate the first ODT circuit when the information signal is enabled and does not receive the ODT signal to inactivate the first ODT circuit when the information signal is disabled.

13. The semiconductor system of claim 10, wherein the ODT signal is not inputted to the first semiconductor chip in a self refresh mode or a deep power down mode.

14. The semiconductor system of claim 10, wherein the first semiconductor chip includes:

a control signal generation circuit configured for receiving the command/address signal to generate a first control signal for controlling reception of the ODT signal;

a first enable signal generator configured for receiving the ODT signal in response to the first control signal to generate a first enable signal; and the first ODT circuit which is configured for being activated in response to the first enable signal.

15. The semiconductor system of claim 14, wherein the control signal generation circuit includes:

a receiver configured for receiving and buffering the command/address signal to generate an internal command signal and an internal address signal;

a command decoder configured for decoding the internal command signal to generate a mode register set signal for setting a mode register and to generate a deep power down mode signal, a self refresh signal, and a power down mode signal;

the mode register configured for storing and outputting the information signal set by the internal address signal in response to the mode register set signal; and an ODT controller configured for receiving the deep power down mode signal, the self refresh signal, and the power down mode signal in response to the information signal to generate the first control signal.

16. The semiconductor system of claim 15:

wherein the deep power down mode signal is enabled during a deep power down mode for electrically disconnecting all current paths in the first and second semiconductor chips;

wherein the self refresh signal is enabled during a self refresh operation; and wherein the power down mode signal is enabled during a power down mode in which generation of an internal clock signal of the first semiconductor chip is stopped.

17. The semiconductor system of claim 15, wherein the ODT controller includes:

a transmission signal generator configured for generating a transmission signal which is disabled when the deep power down mode signal and the self refresh signal are disabled;

a buffer configured for buffering and outputting the power down mode signal or an inverted signal of the power down mode signal in response to the information signal; and a transmission element configured for outputting the output signal of the buffer as the first control signal in response to the transmission signal.

18. The semiconductor system of claim 15, wherein the ODT controller includes:

a buffer configured for buffering and outputting the power down mode signal or an inverted signal of the power down mode signal in response to the information signal;

a transmission element configured for outputting an inverted signal of the output signal of the buffer as the first control signal when the self refresh signal is disabled; and a pull-down element configured for disabling the first control signal in response to the deep power down mode signal.

19. The semiconductor system of claim 14, wherein the second semiconductor chip includes:

a second enable signal generator configured for receiving a ground voltage outputted from the memory controller to generate a second enable signal that is disabled; and a second ODT circuit which is configured for being inactivated in response to the second enable signal.

20. A control signal generation circuit, the circuit comprising:

a receiver configured for receiving and buffering a command/address signal outputted from a memory controller to generate an internal command signal and an internal address signal;

a command decoder configured for decoding the internal command signal to generate a mode register set signal for setting a mode register and to generate a deep power down mode signal, a self refresh signal, and a power down mode signal;

the mode register configured for storing and outputting an information signal set by the internal address signal in response to the mode register set signal; and an ODT controller configured for receiving the deep power down mode signal, the self refresh signal, and the power down mode signal in response to the information signal to generate a control signal, wherein the control signal is enabled to activate an ODT circuit for receiving an ODT signal when the power down mode signal and the information signal are enabled.

21. The circuit of claim 20:

wherein the deep power down mode signal is enabled during a deep power down mode for electrically disconnecting all current paths;

wherein the self refresh signal is enabled during a self refresh operation; and wherein the power down mode signal is enabled during a power down mode in which generation of an internal clock signal is stopped.

22. The circuit of claim 20, wherein the ODT controller includes:
- a transmission signal generator configured for generating a transmission signal which is disabled when the deep power down mode signal and the self refresh signal are disabled;
- a buffer configured for buffering and outputting the power down mode signal or an inverted signal of the power down mode signal in response to the information signal; and
- a transmission element configured for outputting the output signal of the buffer as the control signal in response to the transmission signal.

23. The circuit of claim 20, wherein the ODT controller includes:
- a buffer configured for buffering and outputting the power down mode signal or an inverted signal of the power down mode signal in response to the information signal;
- a transmission element configured for outputting an inverted signal of the output signal of the buffer as the control signal when the self refresh signal is disabled; and
- a pull-down element configured for disabling the control signal in response to the deep power down mode signal.

* * * * *